United States Patent [19]
Kashyap

[11] Patent Number: 5,832,011
[45] Date of Patent: Nov. 3, 1998

[54] LASER

[75] Inventor: Raman Kashyap, Suffolk, United Kingdom

[73] Assignee: British Telecommunications public limited company, London, England

[21] Appl. No.: 522,424

[22] PCT Filed: Mar. 18, 1994

[86] PCT No.: PCT/GB94/00556

§ 371 Date: Oct. 10, 1995

§ 102(e) Date: Oct. 10, 1995

[87] PCT Pub. No.: WO94/22187

PCT Pub. Date: Sep. 29, 1984

[30] Foreign Application Priority Data

Mar. 25, 1993 [EP] European Pat. Off. .............. 93302303
Nov. 4, 1993 [GB] United Kingdom ................... 9322703

[51] Int. Cl.$^6$ ...................................................... H01S 3/10
[52] U.S. Cl. ................................... 372/23; 372/6; 385/37
[58] Field of Search .............................. 372/6, 23.96, 92, 372/102, 97; 385/90.88, 89.37

[56] References Cited

U.S. PATENT DOCUMENTS

| | | | |
|---|---|---|---|
| 4,199,222 | 4/1980 | Ikushima et al. .......................... | 385/93 |
| 4,786,132 | 11/1988 | Gordon .................................... | 385/37 |
| 4,955,028 | 9/1990 | Alferness et al. ........................ | 372/92 |
| 5,181,213 | 1/1993 | Shinokura ................................. | 372/92 |
| 5,305,336 | 4/1994 | Adar et al. ................................ | 372/6 |
| 5,485,481 | 1/1996 | Ventrudo et al. ........................ | 372/108 |

FOREIGN PATENT DOCUMENTS

| | | | |
|---|---|---|---|
| 0435217-A3 | 7/1991 | European Pat. Off. ................... | 372/6 |
| A0435217 | 7/1991 | European Pat. Off. . | |
| 61-64182 | 4/1986 | Japan ....................................... | 372/92 |
| 1-297874 | 11/1989 | Japan ....................................... | 372/6 |
| A254183 | 9/1992 | United Kingdom . | |

OTHER PUBLICATIONS

Bird et al, "Narrow Line Semiconductor Laser Using Fibre Grating", Electronics Letters, vol. 27, No. 13, 20 Jun. 1991, Enage GB, pp. 1115–1116.
Handerek et al, "Two–Frequency Dye Laser With Accurately Controllable Frequency Difference", Review Of Scientific Instruments, vol. 62, No. 12, Dec. 1991, New York US, pp. 2936–2939.
Urquhart, "Review of Rare Earth Doped Fibre Lasers and Amplifiers", IEE Proceedings J. Optoelectronics, vol. 134, No. 6, Dec. 1988, Stevenage GB, pp. 385–407.
Liou et al, "Narrow–Linewidth Fibre External Cavity Injection Lasers", Electronics Letters, vol. 21, No. 20, 26 Sep. 1985, Enage GB, pp. 933–934.
Patent Abstracts of Japan, vol. 14, No. 400 (P–1098) (4343) 29 Aug. 1990 & JP,A,02151819 (Matsushita Electric) 11 Jun. 1990.
Stern et al, "Passive Optical Local Networks for Telephony Applications and Beyond", Electronics Letters, vol. 23, No. 24, 19 Nov. 1987, Enage GB, pp. 1255–1257.
G. R. Hill, "A Wavelength Routing Approach To Optical Communications Networks", IEEE Infocom 1988, pp. 354–362. No Month.
Bird, D.M. et al., "Narrow Line Semiconductor Laser Using Fiber Grating", Elec. Lett. 27(13),Jun. 20, 1991 pp. 1115–1116.

*Primary Examiner*—Rodney B. Bovernick
*Assistant Examiner*—Robert E. Wise
*Attorney, Agent, or Firm*—Nixon & Vanderhye P.C.

[57] ABSTRACT

A laser having two feedback elements at least one which is wavelength selective, is provided with a demountable optical connector located between the gain medium of the laser and the wavelength selective feedback element. An optical waveguide is utilized to direct optical radiation between the demountable optical connector and the wavelength selective feedback element. The demountable optical connector, for example, a mechanical fibre connector allows the wavelength selective feedback element, for example, a fibre grating, to be exchanged cheaply, simply and quickly, and thus allows the wavelength of operation of the laser to be altered.

24 Claims, 13 Drawing Sheets

LASER

BACKGROUND OF THE INVENTION

1. Field of the Invention

The present invention relates to a laser, and in particular to a laser whose operating wavelength may be easily altered.

2. Related Art

The development of compact, relatively inexpensive lasers, in particular semi-conductor lasers, but more recently also fibre lasers, has led to an enormous growth in optical communication systems. Initially lasers in optical communications systems were used simply as a source of optical frequency noise, the wavelength and bandwidth of these lasers being relatively unimportant. The parallel development of optical fibres, used as the transmission medium in these telecommunications systems, rapidly led to a requirement for lasers to operate within specific wavelength ranges. Thus it was discovered that optical fibres made from the preferred material of silica, exhibited three low loss "windows" in the optical spectrum, centred at approximately 850 nm, 1300 nm and 1550 nm. Single wavelength point to point optical communications systems thus required laser sources whose operating wavelength lay within one of the low loss windows of the optical fibre used. These simple types of optical communications systems are the ones which are predominately in use at present in telecommunications networks, however there is a requirement for future optical communications networks to utilise the huge spectral bandwidth available from optical fibres more efficiently.

In addition to simply utilising several wavelengths on the same point to point optical communications link, there are many proposals to use hundreds, or even thousands, of different wavelengths across multipoint optical networks. Such proposals may be based on a broadband optical path approach or a wavelength selective optical path approach, or on some combination of the two approaches. A feature of the broadband approach is that any signal injected into the network is broadcast to all receivers whether it is needed or not. This may be considered inefficient but it can lead to a good degree of flexibility, and this is exploited for example by means of Passive Optical Network configurations see for example J R Stern et Al "Passive Optical Local Networks for telephony applications and beyond", Electronics Letters Volume 23, number 24, 1255–1257, November 1987. A feature of wavelength selective optical networks is that optical power at a given wavelength is directed only to where it is required and a given wavelength can be reused in different parts of the network. This leads to a reduction in the total number of different wavelengths needed for a given network throughout, but requires that wavelength multiplexing and demultiplexing components are provided in the network, see for example G R Hill "A wavelength routing approach to optical communications networks" IEEE INFOCOM '88.

The aim for both of these approaches, is to extend the optical network as far as possible to the customer, preferably supplying an optical communications link to the customer's premises.

The demands made of laser sources for such future optical communications networks are thus quite different from those placed on laser sources presently used.

SUMMARY OF THE INVENTION

According to the present invention there is provided a laser comprising first and second feedback elements defining a laser cavity, a gain medium within the laser cavity, a demountable optical connector and an optical waveguide, wherein the second feedback element is wavelength selective, the demountable optical connector is located between the gain medium and the second feedback element and the optical waveguide is located to direct optical radiation between the demountable optical connector and the second feedback element.

Thus the present applicant has realised that if a demountable optical connector is provided within the cavity of a laser, between the gain medium and a wavelength selective feedback element, the wavelength selective feedback element alone may be easily exchanged for another such element so as to alter simply and cheaply the operating wavelength of the laser. The use of an intra-cavity demountable optical connector allows the major components of the laser to remain in place when a change of laser operating wavelength is required, and allows what can be a relatively cheap wavelength selective optical feedback element simply to be exchanged for another such element. The provision of an optical waveguide between the demountable optical connector and the wavelength selective optical feedback element ensures that the laser cavity is easily re-established on exchanging optical feedback elements without alignment difficulties. The demountable optical connector may comprise a standard mechanical connector.

The wavelength selective feedback element may comprise any suitable reflection filter, for example a multiple dielectric layer filter, but preferably comprises a grating in an optical fibre. Such a grating may be optically written into the core of a photosensitive optical fibre by the method described in "All-fibre Narrowband Reflection Gratings at 1500 nm", R Kashyap et al, Electronics Letters, 22 May 1990, Vol 26, No. 11, pp730–731, which is hereby incorporated by reference.

Preferably the optical waveguide comprises an optical fibre. In this case the fibre grating may be incorporated in a short length of optical fibre, for example 1 meter, with one half of a mechanical connector provided on each end of the fibre. Such a length of optical fibre when in place in the laser thus forms both the wavelength selective optical feedback element, and part of the laser cavity. In operation, lasing would occur between the first feedback element and the fibre grating within the optical fibre. Should the operating wavelength of the laser need to be changed, the optical fibre is removed by disconnecting the intra cavity demountable optical connector, and a similar length of fibre having a fibre grating of a different pitch, and thus reflection wavelength, is connected in its place. Thus it can be appreciated that a large number of very cheap connectorised lengths of optical fibre (often called fibre pigtails) each having a fibre grating of a different pitch, can be provided to a technician responsible for operation of part of an optical network. The technician is then able quickly, cheaply, and simply to alter the operating wavelength of a laser according to the present invention in any given location.

Preferably the gain medium of the laser comprises a semiconductor laser diode. A semiconductor laser diode provides a simple, cheap, electrically pumped, reasonably broadband source of optical radiation. The wavelength selective feedback element in this case allows any wavelength within the gain bandwidth of the semiconductor laser diode to be selected as the operating wavelength of a laser according to the present invention. Advantageously the semiconductor laser diode can be mounted in a package which includes one half of a demountable optical connector. The diode and connector are aligned so that optical radiation from the diode is coupled into the waveguide leading from the optical connector to the wavelength selective optical feedback element. In this configuration the facet of the laser diode optically closest to the optical connector is anti-reflection coated, and lasing occurs between the other facet of the laser diode and the wavelength selective feedback element. The package is thus self contained, and need not be disturbed when the operating wavelength of the laser is changed by, for example exchanging one fibre pigtail connected to the package for another fibre pigtail.

Alternatively the gain medium of a laser according to the present invention may comprise a fibre doped with a suitable material to render the fibre active, e.g. a rare earth element. Suitable rare earth elements include, inter alia, erbium, neodymium, praseodymium and holmium. Materials other than the rare earth elements, e.g. semiconductors, could be used as alternatives, optionally in a colloidal distribution in the glass host of the fibre. The fibre pigtail which contains the active material could be a silica based or a fluorozirconate based glass or any other appropriate host. Hence the advantages of the present invention may be provided in combination with the known advantages of fibre lasers over semiconductor lasers. Preferably in this embodiment a first end of the doped fibre is provided with a broadband reflector, for example supply by mirroring an end of the doped fibre, or alternatively by connecting the doped fibre to a fibre loop mirror, while a second end of the doped fibre has low reflectivity, for example by being anti-reflection coated or angled and is connectorised i.e. is attached to one component of the demountable optical connector. In use lasing thus occurs between the broadband reflector and the wavelength selective feedback element, for example a grating in a fibre pigtail. In this latter case optical radiation is confined to a waveguide along the whole length of the laser cavity, thus eliminating the need for a free space to waveguide interface and simplifying alignment of the laser cavity.

Advantageously a laser according to the first, or to the second embodiment of the invention comprises a second feedback element which feeds back optical radiation at a plurality of distinct wavelengths into the laser cavity. This causes the laser to lase at a plurality of distinct wavelengths. Such multi-wavelength operation of a laser is advantageous, for example for generating wavelength combs for use in WDM networks. Clearly the use of a single multi-wavelength source at e.g. the head-end of a PON to launch optical radiation at a plurality of wavelengths into a single fibre, is preferable to the use of many single wavelength sources in conjunction with the necessary wavelength couplers.

Although multi-wavelength operation of a laser according to an embodiment of the present invention can be achieved by connecting together a plurality of fibre pigtails, each having a single fibre grating, to form the second feedback element, multi-wavelength operation is particularly simply achieved by utilising a fibre pigtail having a plurality of fibre gratings. Furthermore, since this pigtail can be easily exchanged for another pigtail having either a plurality of fibre gratings of different pitch, or for another pigtail having a single fibre crating, operation of the laser can be simply and cheaply altered, not only in wavelength, but also between multi-wavelength and single wavelength operation.

BRIEF DESCRIPTION OF THE DRAWINGS

Embodiments of the present invention will now be described by way of example only, and with reference to the drawings in which.

DETAILED DESCRIPTION OF EXEMPLARY EMBODIMENTS

Figure 1:
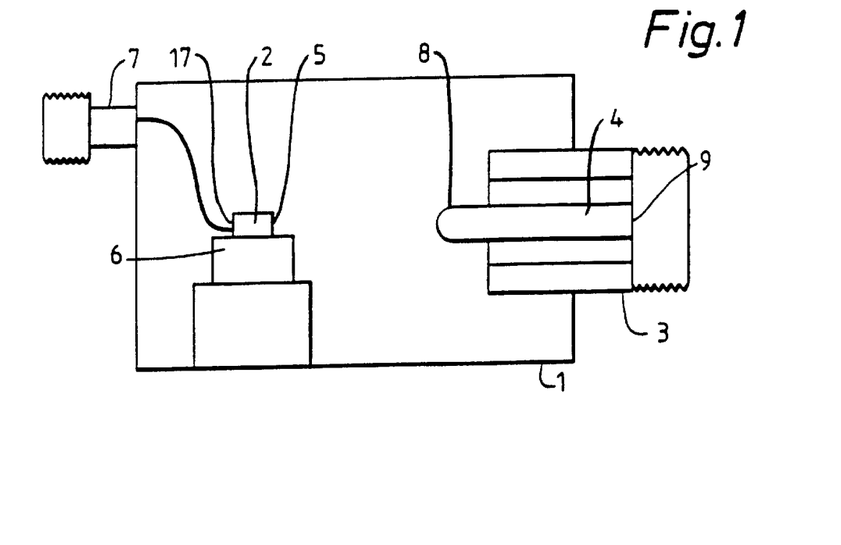
FIG. 1 is a schematic diagram of a package forming part of a semiconductor laser according to a first embodiment of the present invention.
Figure 2:
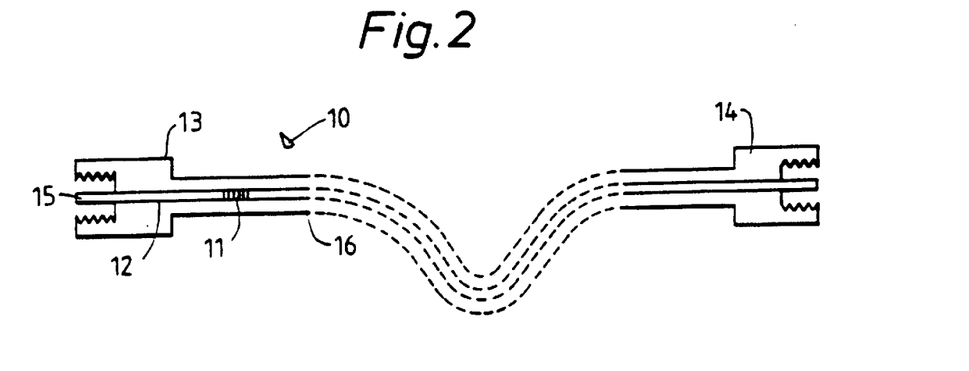
FIG. 2 shows a fibre pigtail having a fibre grating.

FIG. 1 shows a package comprising a container 1, a semiconductor laser diode 2, a component (i.e. one half) of a demountable optical connector 3, and a length of optical fibre 4 held by the component 3. The semiconductor laser diode 2 is anti-reflection coated on its facet 5 which faces the component of the optical connector 3, the diode 2 is mounted on a heat sink 6, and electrically connected to a modulation connector 7. The optical fibre 4 has a lens 8 formed at one end, and is anti-reflection coated at the other end 9. The component of the connector 3 is mounted to the container 1 so that the fibre 4 is aligned to receive optical radiation emitted by the semiconductor laser diode 2. FIG. 2 shows a ruggedised fibre pigtail 10 having a fibre grating 11. The fibre 12 is connectorised at each end with a component of a demountable optical connector 13, 14 which is able to mate with the component of the optical connector 3 of the package shown in FIG. 1. The end 15 of the fibre 12 closest to the fibre grating 11 is anti-reflection coated, and the fibre 12 is protected by a buffer layer 16.

In use the fiber pigtail 10 is connected to the package shown in FIG. 1 by screwing together the two components 3 and 13 of the demountable optical connector. The assembled laser lases between the uncoated facet 17 of the semiconductor laser diode 2 and the fibre grating 11 in the fibre pigtail 10. The wavelength of operation λ of the laser is determined by the pitch Λ of the grating in accordance with the following known relationship λ=2$n_e$ Λ, where $n_e$ is the effective mode index of the mode guided by the fibre 12, which can be easily calculated by the skilled person for any particular fibre from a knowledge of the fibre refractive index profile. A range of fibre pigtails 10 having different pitch fibre gratings 11, each resulting in a different predetermined wavelength of operation λ of the laser, can thus be provided. When the wavelength of operation needs to be altered, a technician simply disconnects the optical connector 13 from the package shown in FIG. 1, and replaces the fibre pigtail 10 with another pigtail giving the desired operating wavelength of the laser.

Figure 3:
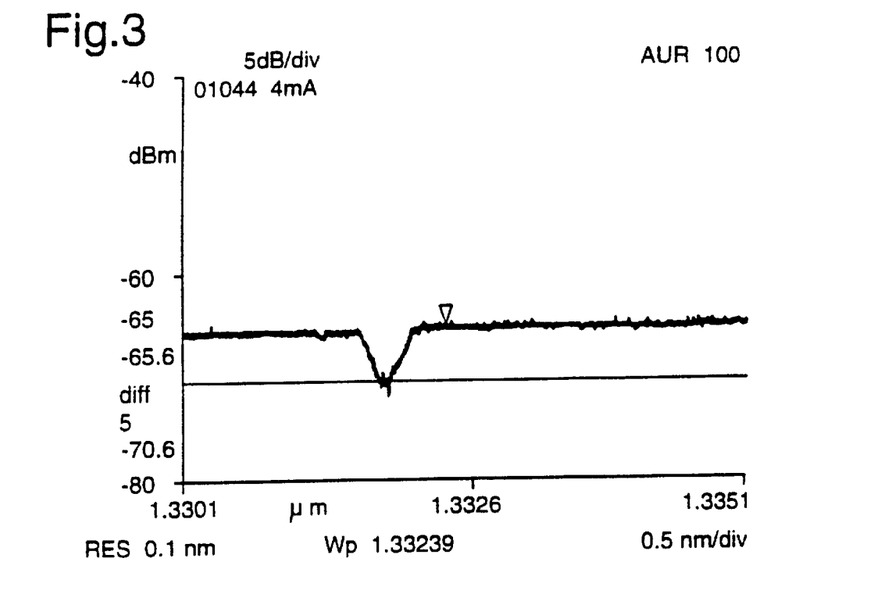
FIG. 3 is the optical transmission spectrum of the fibre pigtail of FIG. 2.

The optical transmission spectrum of a particular fibre pigtail 10, having a fibre grating 11, is shown in FIG. 3. The pitch of the fibre grating 11 in this fibre pigtail 10 has been chosen so as to give a wavelength of operation of a laser of 1.32 μm, and it can be seen from FIG. 3 that the transmission spectrum of the fibre pigtail 10 shows a loss of approximately 5 dB centred at 1.332 μm.

Figure 4:
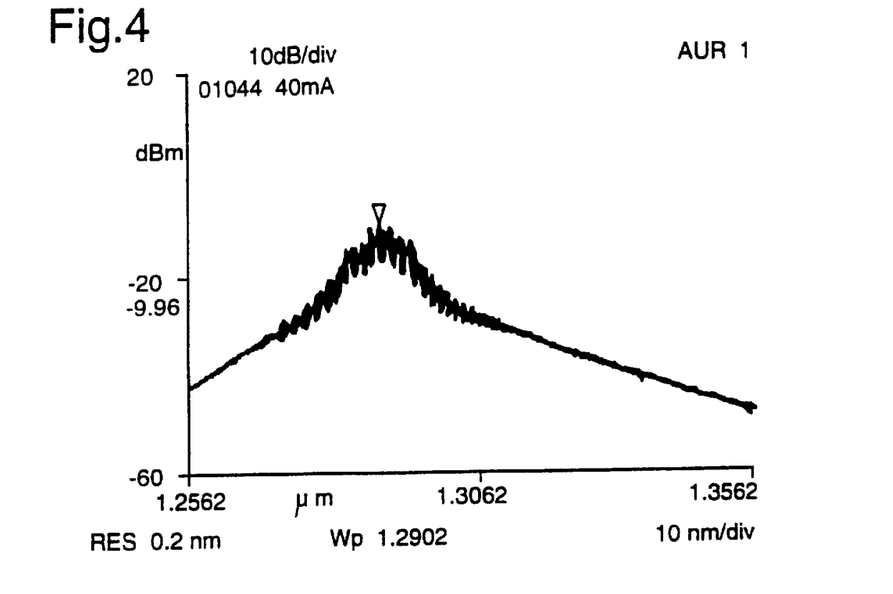
FIG. 4 shows the output spectrum of the semiconductor laser package of FIG. 1 when connected to a conventional fibre pigtail.
Figure 5A:
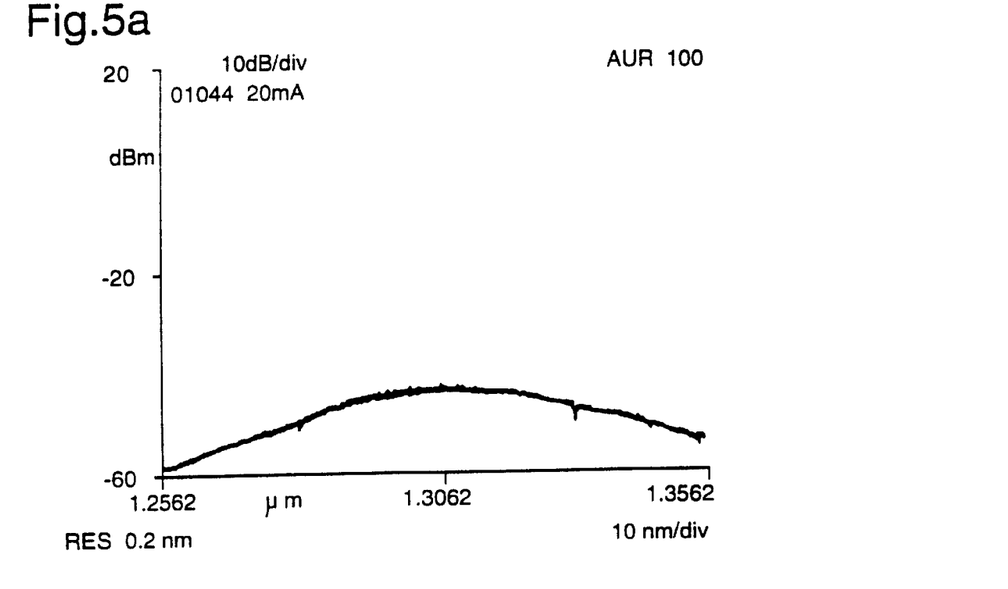
FIGS. 5a to g show the output spectrum of the semiconductor laser package of FIG. 1 when connected to the fibre pigtail of FIG. 2 for different drive currents.
Figure 5B:
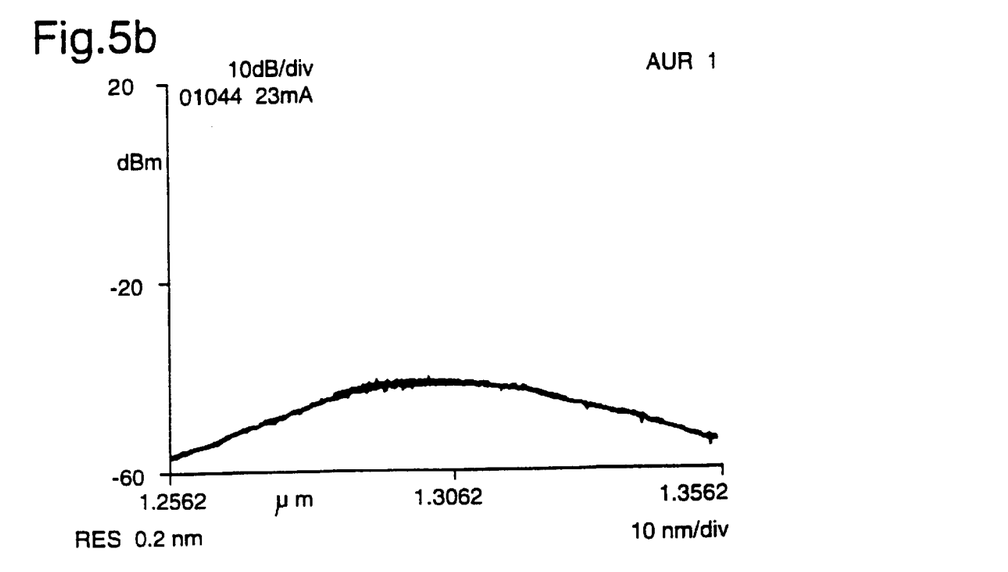
Figure 5C:
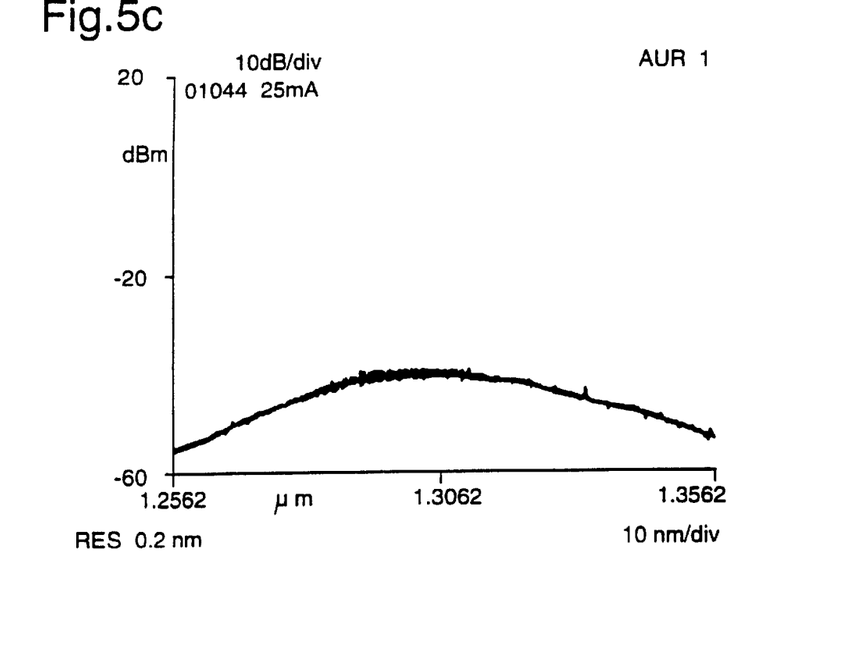
Figure 5D:
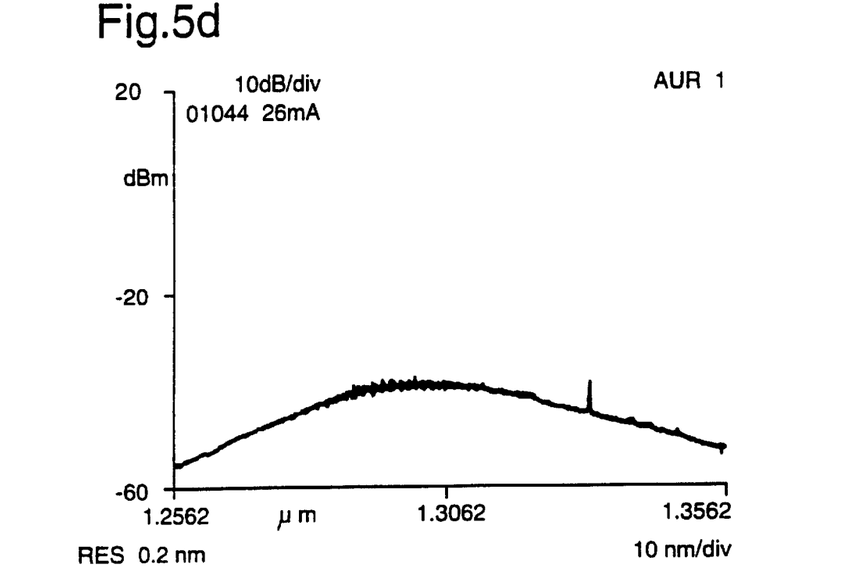
Figure 5E:
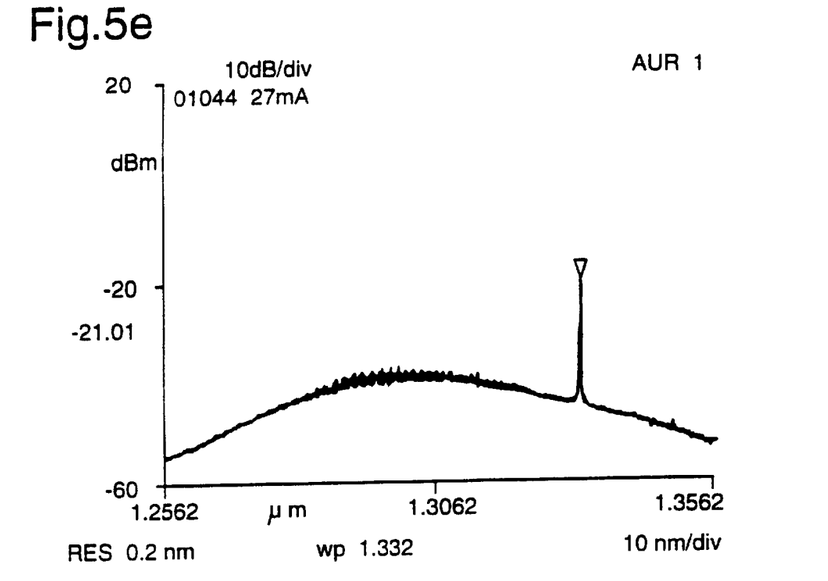
Figure 5F:
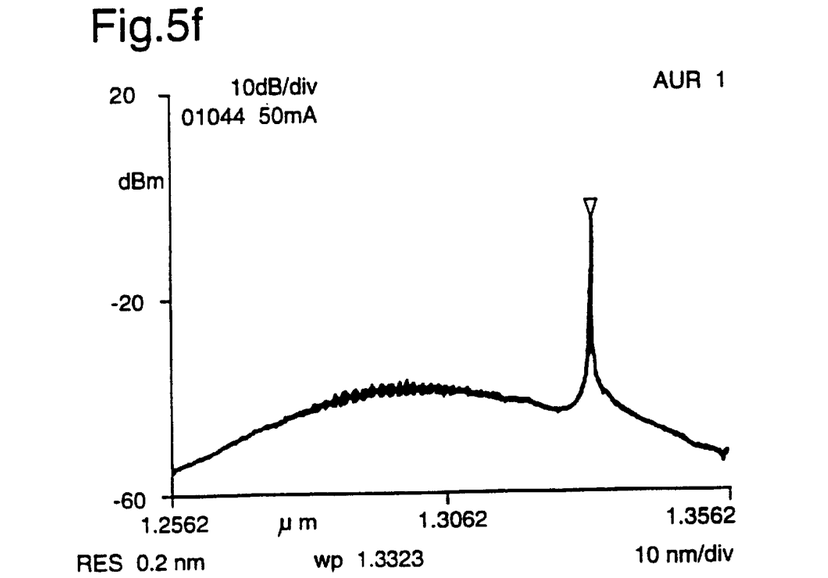
Figure 5G:
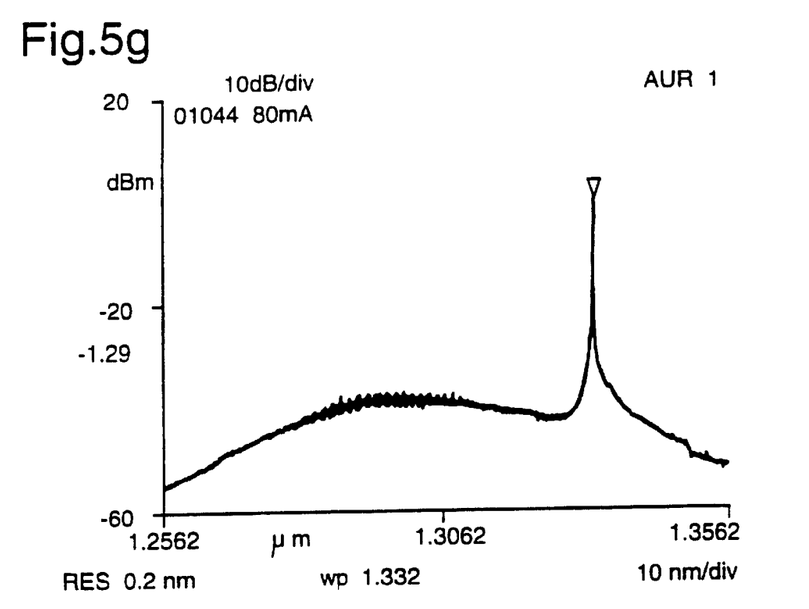

FIG. 4 shows the optical output spectrum of the semiconductor laser package of FIG. 1, when the laser has no wavelength selective feedback. The graph of FIG. 4 has been obtained by connecting one end of a conventional fibre pigtail i.e. a pigtail not having a fibre grating 11, to the demountable optical connector 3 of the laser package, and the other end of the fibre pigtail to an optical spectrum analyser. As can be seen from FIG. 4, the output spectrum is, as expected, very broad band, occupying some 30 nm even at a drive current of 90 mA. FIGS. 5a to g demonstrate how a specific operating wavelength of the laser package of FIG. 1 can be chosen within this broad gain bandwidth by connecting an appropriate fibre pigtail 10, having a fibre grating 11, to the laser package. FIGS. 5a to g show the output spectrum of the laser package when connected to the fibre pigtail whose transmission spectrum is shown in FIG. 3. The drive current or the semiconductor laser diode 2 for each of the graphs shown in FIGS. 5a to 5g was respectively 20, 23, 25, 26, 27, 50, and 80 mA. Lasing at the reflection wavelength of the fibre grating 11 i.e. 1.332 μm, can be clearly seen in FIGS. 5d to 5g.

Figure 6A:
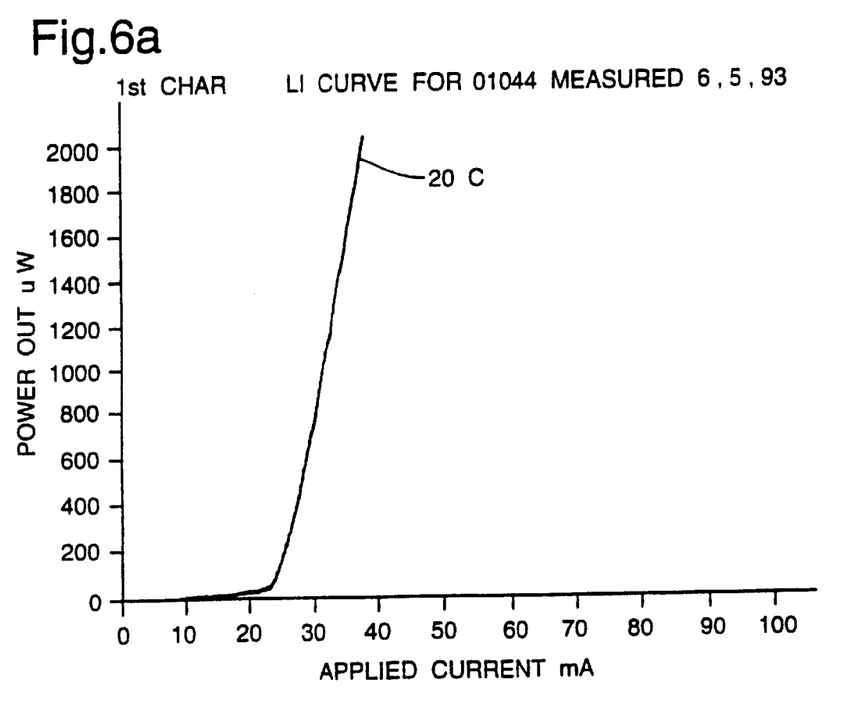
FIGS. 6a and b show respectively the L/I characteristic of the laser package of FIG. 1 when connected to a conventional fibre pigtail and when connected to a fibre pigtail according to the present invention as shown in FIG. 2.
Figure 6B:
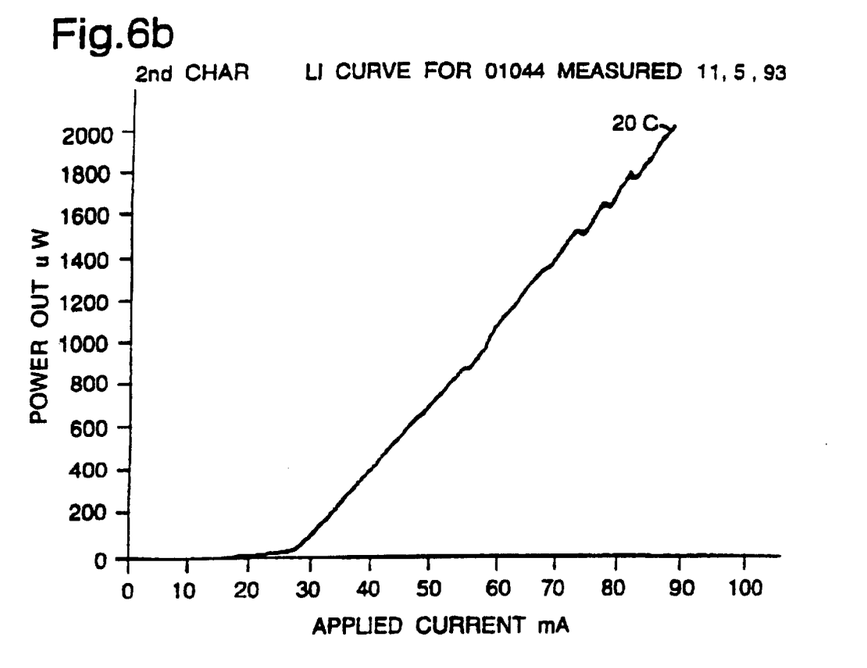

FIGS. 6a and b show respectively the L/I characteristic for the semiconductor laser without wavelength selective feedback, and with wavelength selective feedback. The slope efficiency of the laser is lower, and its threshold somewhat higher, when operating with wavelength selective feedback. This is because the wavelength of operation of the laser was deliberately chosen to be remote from the peak of the material gain, in order to demonstrate that lasing at such a remote wavelength could be selected, Thus from FIG. 5 it can be seen that for this particular semiconductor laser device the operating wavelength can be chosen within a bandwidth of approximately 80 nm, by an appropriate choice of the pitch of the fibre grating 11 of a fibre pigtail 10.

Figure 7:
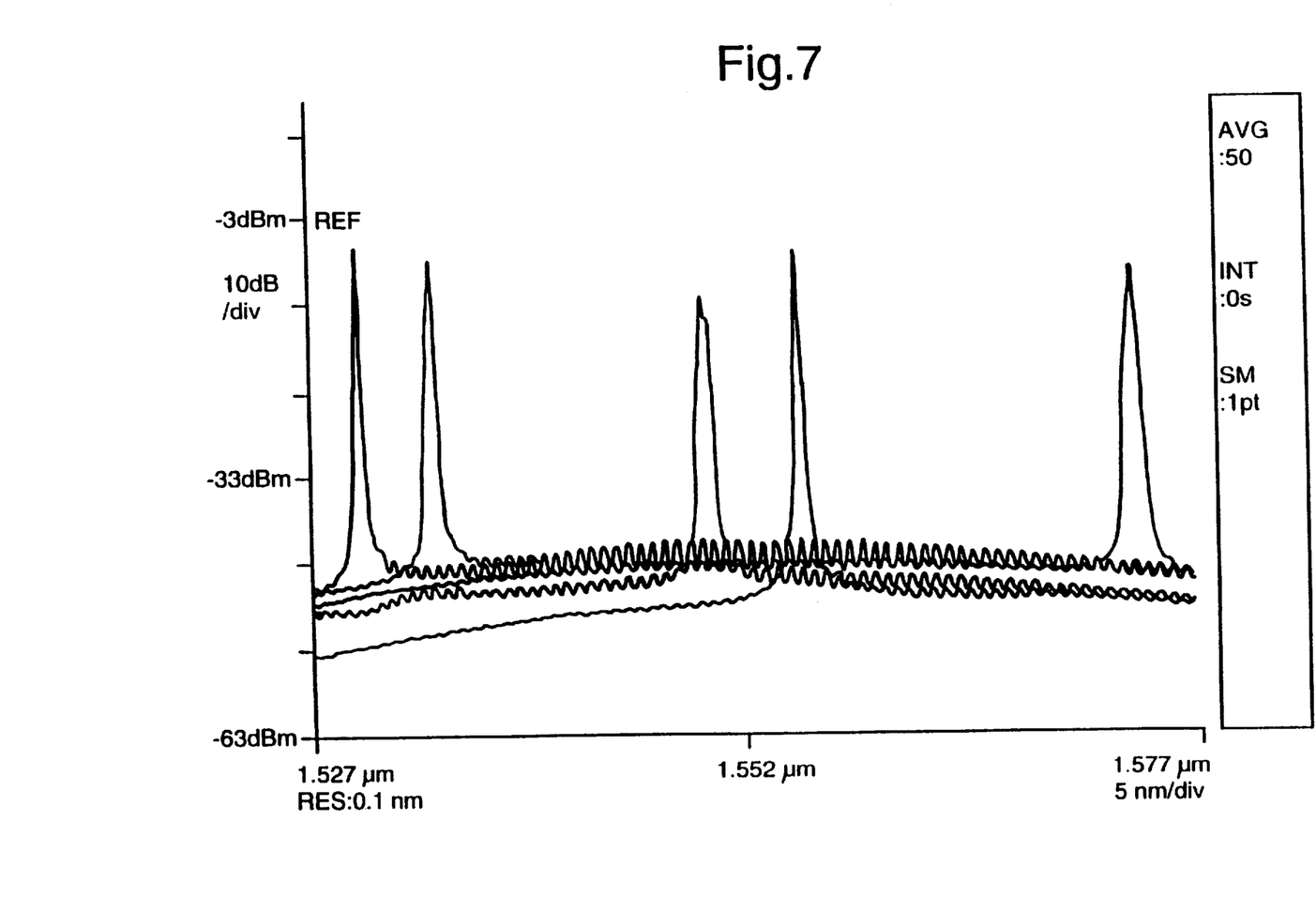
FIG. 7 shows a superposition of five separate output spectrums from a laser according to a first embodiment of the present invention, each spectrum is obtained by utilising one of five different fibre grating pigtails according to the present invention.

In order to demonstrate the flexibility of this approach to altering the wavelength of operation of a laser, five fibre grating reflection pigtails having reflection wavelengths in the range of 1529 nm to 1573. 6 nm were formed. By employing one of these pigtails a semiconductor laser according to the present invention having a gain medium centred about 1550 nm can be made to lase at any one of these five wavelengths. FIG. 7 shows a superposition of the five separate spectrums obtained when each of the five pigtails are used. Typical grating bandwidths were 0. 5 nm. A sideband suppression of between 25–40 dB was observed depending on the wavelength of operation.

Utilising a fibre grating pigtail having a reflection wavelength of 1.313 μm, a BER (Bit Error Rate) of $10^{-9}$ was measured at 1.2 $Gbs^{-1}$ over 50 km of fibre with a receiver sensitivity of −25 Bm. This BER was identical to that achieved in a back-to-back measurement.

Hence these semiconductor lasers are highly flexible, giving the possibility of single frequency operation at multi-gigabit modulation rates, due to the compact nature of the external cavity, estimated to be around 18 mm long (equivalent to a modulation rate of 5.55 GHz).

There is a risk that the mechanical forces required to connect the demountable optical connector 13 of the fibre pigtail 10 to the component of the demountable optical connector 3 of the package shown in FIG. 1, will disturb the alignment of the optical fibre 4 with the semiconductor laser diode 2. In order to avoid such a risk, rather than mounting the optical connector 3 to the container 1, the fibre 4 can be mounted directly to the container 1, and be of sufficient length that its end 9 held by connector 3 is remote from container 1. In this case any mechanical perturbation of end 9 of optical fibre 4 during connection with connector 13 will not be transmitted to the opposite end 8 of the fibre 4. This arrangement allows the attachment of fibre 4 to container 1 to be simplified, since a sub-assembly for mounting connector 3 to container 1 able to withstand the stress and strain of connectorisation is not required. Furthermore this arrangement avoids the difficulties which may be encountered in forming a lens 8 at one end, and polishing the opposite end 9, of a very short length of optical fibre 4.

Figure 8:
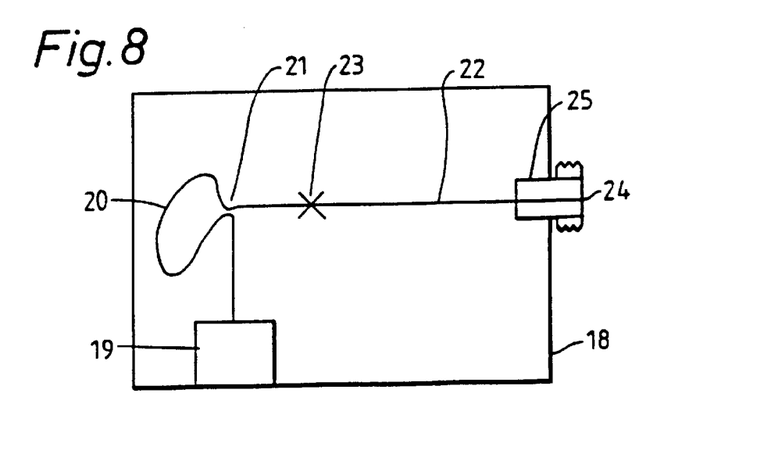
FIG. 8 is a schematic diagram of a package forming part of a fibre laser according to a second embodiment of the present invention.

FIG. 8 shows a second embodiment of the present invention in which the gain medium of the laser comprises a fibre doped with erbium. Within a container 18 is mounted a semiconductor pump device 19, which in this embodiment is a laser device, connected to a fibre loop mirror 20 formed by a WDM fused tapered coupler 21. A length of erbium doped fibre 22 is connected at one end 23 to the fibre loop mirror 20 and at the other end 24 to a component of a demountable optical connector 25, the end 24 of the erbium doped fibre 22 being anti-reflection coated. The wavelength of operation of the semiconductor diode pump 19 is in this embodiment 980nm, and the wavelength dependence of the coupling ratio of the WDM coupler 21 is chosen so that the 980 nm pump radiation passes through the fibre loop mirror 20 to the erbium doped fibre 22, while radiation at the longer lasing wavelength returning from the erbium doped fibre 22 is reflected by the fibre loop mirror 20. In use, a fibre pigtail as shown in FIG. 2 is connected via the optical connector 13 and 24 to the erbium doped fibre 22. Lasing then occurs between the fibre loop mirror 20 and the fibre grating 11 in the fibre pigtail 10. The operating wavelength of the laser, within the gain bandwidth of the erbium doped fibre 22, can be chosen in the same way as for the embodiment of FIG. 1.

Figure 9:
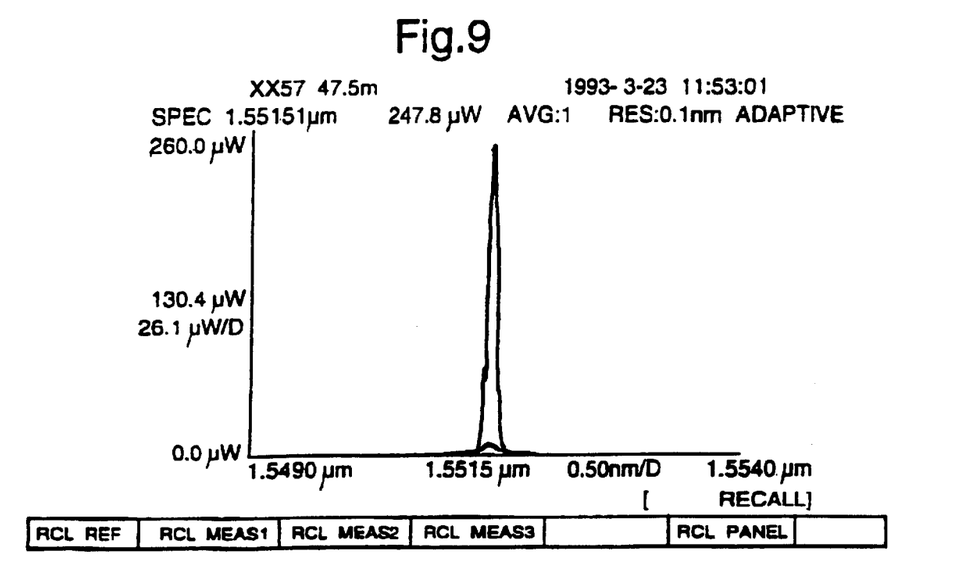
FIG. 9 shows the output spectrum of the fibre laser of FIG. 8 when connected to a first fibre pigtail according to the present invention.

FIG. 9 shows the optical output spectrum of such a fibre laser. The laser employs a half meter length of erbium doped fibre having an unpumped absorbtion of 80 dB/m at 1530 nm, and a fibre pigtail 10 having a fibre grating 11 with a reflectivity centred at 1551. 5 nm of around 80%. A polarisation controller was used within the loop mirror to optimise the output. The laser was found to have a threshold of 15 mW optical power in the fibre, and an output power at the lasing wavelength of around 0.5 mW. The low power is thought to be due to the high losses in the fusion splices between highly dissimilar fibres, since no optimisation of the splice loss was attempted.

Figure 10:
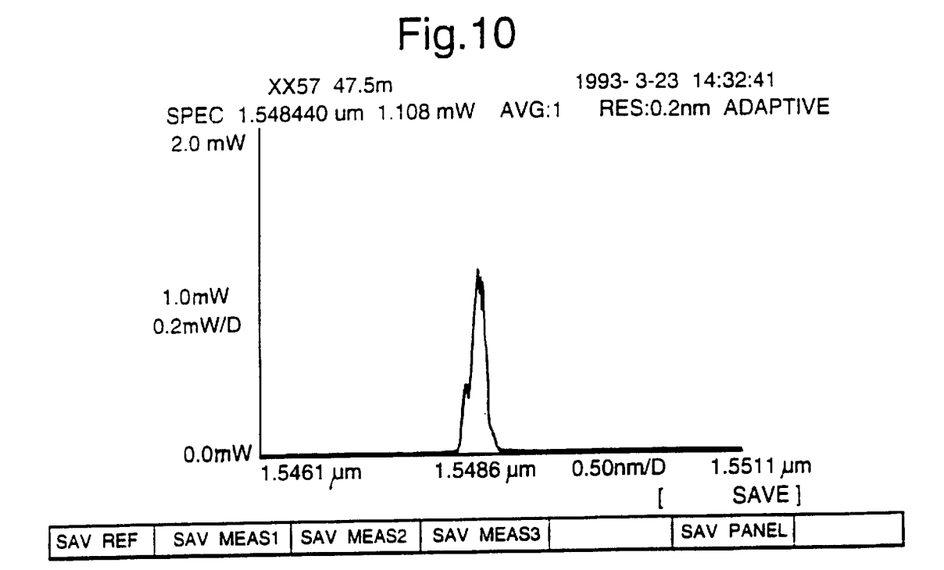
FIG. 10 shows the output spectrum of the fibre laser of FIG. 8 when connected to a second fibre pigtail according to the present invention.

In order to demonstrate the selection of an alternative lasing wavelength within the gain bandwidth of the fibre laser, the first fibre pigtail was disconnected and a second fibre pigtail having a fibre grating with a centre wavelength of 1548. 5 nm was connected to the erbium doped fibre via the optical connector 13, 14. FIG. 10 shows the output spectrum of the fibre laser when lasing at the operating wavelength defined by the second fibre pigtail. With 150 mW optical pump power, the output power from this laser was in excess of 1 mW.

Figure 11:
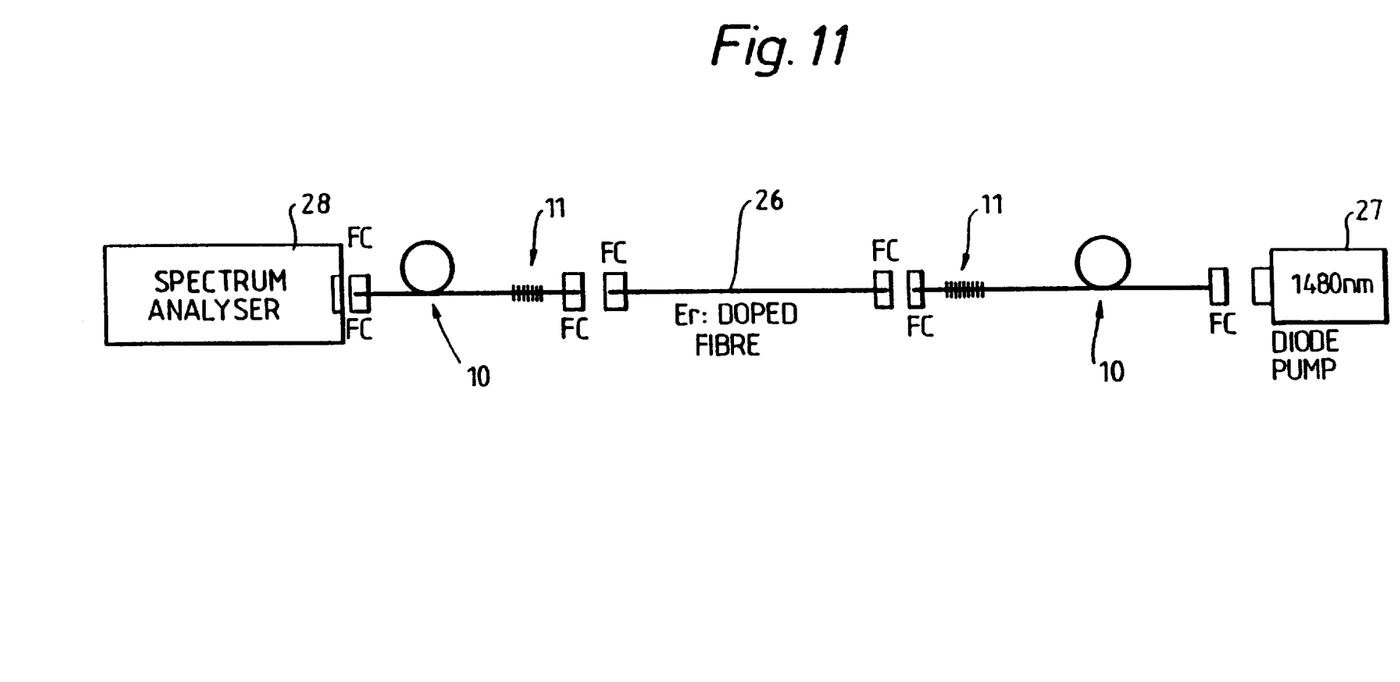
FIG. 11 is a schematic diagram of an alternative configuration of the second embodiment of the present invention.
Figure 12:
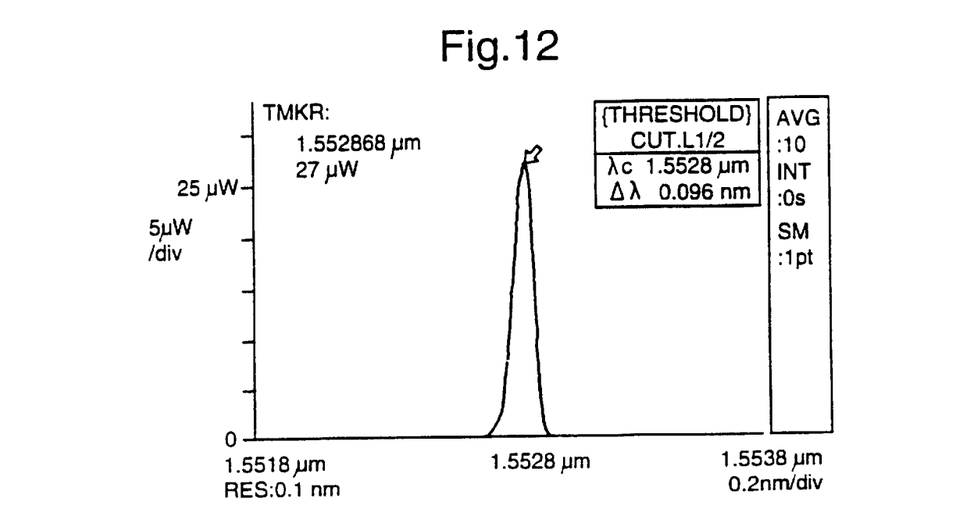
FIG. 12 shows the output spectrum of the fibre laser of FIG. 11.

An alternative configuration of the second embodiment of the present invention, in which the gain medium comprises a rare earth doped fibre, is shown in FIG. 11. Here, rather than employing one broadband reflector 20 and one narrow band reflector 11, two narrow band reflectors 11 are employed to form the laser cavity. Two fibre pigtails 10 having identical fibre reflection gratings 11 with reflectivities of −70% at 1552. 9 nm, and FC-PC connectors at each end were connected to a 15 cm long length of erbium doped fibre 26. A 1480 nm diode laser 27 was used to pump the fibre laser through one of the fibre grating pigtails 10. The other fibre grating pigtail 10 was connected to a spectrum analyser 28 in order to monitor the output of the laser. FIG. 12 shows a typical optical spectrum of the laser of FIG. 11.

An advantage of employing two narrow band reflectors 11, where these reflectors are transparent to the wavelengths other than the ones they reflect, for example as are fibre reflection gratings, is that the laser is then transparent at all wavelengths other than the wavelength, or wavelengths, at which it is lasing. Such a laser could thus for example be employed in a transparent optical network to input an additional wavelength into the network, while allowing wavelengths already present in the network to pass through the laser unaffected.

The second embodiment of the present invention can utilise a silica or fluorozirconate fibre and the dopant type and the operating wavelength of the pump source can each be selected in accordance with the desired operational wavelength of the laser. Additionally or alternatively, the broadband feedback element which, in FIG. 3, is provided by the fibre loop mirror, can be provided by some alternative means, for example discrete optics or a reflective coating or the like.

The fibre pigtails of the invention should be chosen to be compatible with any transmission fibre with which the laser according to the invention is to be used. That is, the core size and/or mode field radius of the fibre pigtail should be a reasonable match for that/those of any associated transmission fibre. Both single mode and multimode fibre pigtails could be provided, either for all grating types (i.e. pitch/wavelength) or for only some grating types. The fibre pigtails for use with this invention will preferably be labelled, or otherwise (by sleeving colour, etc) distinguished, so that the operating wavelength of the grating in any particular system is clearly identifiable in the field.

A further alternative, which is in effect a variant of the second embodiment, involves providing both a gain medium and the second feedback element in the fibre pigtail, the pump 19 and the broadband reflector 20 being housed in container 18. Typically in such an arrangement, no gain medium would be included in the optical path, within the container 18, between the reflector 20 and the connector 25, although it would be possible to include such a gain medium. The gain medium within the fibre pigtail 10 would typically be located apart from the grating 11, the gain material being provided between the connector 13, which mates with the connector part 25 on the housing 18, and the grating 11. However it is possible to provide a distributed feedback effect for the laser by co-locating the grating 11 and the gain medium.

In such arrangements the grating 11 and the gain medium could be provided in different hosts, for example a fluorozirconate glass host for the gain medium and a germania silica glass host for the grating, the different glass fibres being spliced or otherwise joined in any known manner.

Figure 13:
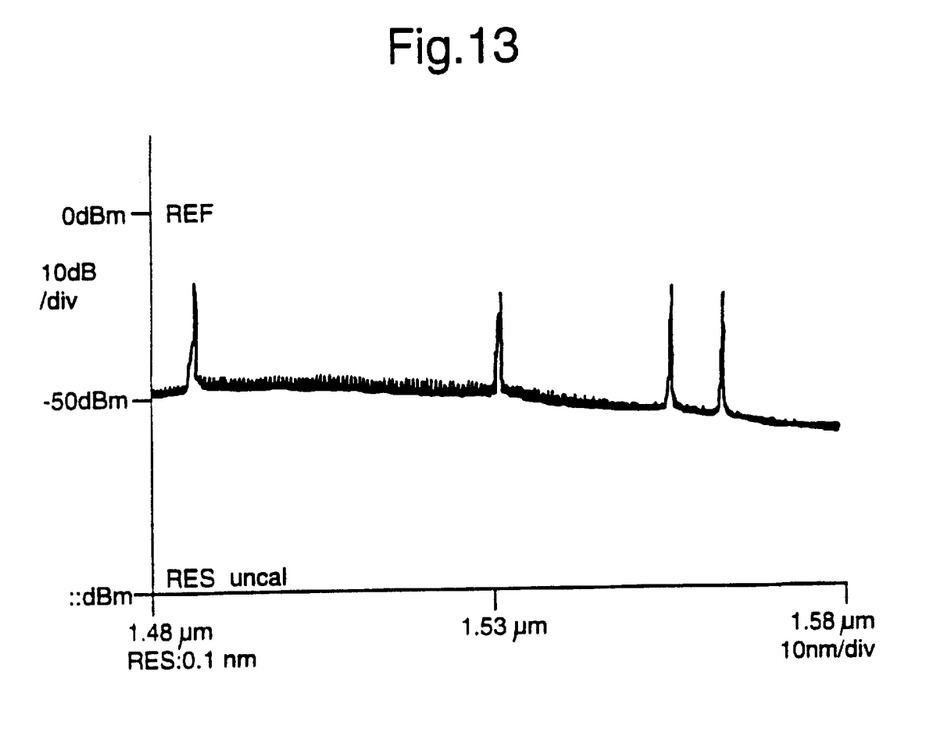
FIG. 13 shows the output spectrum of a semiconductor laser according to the first embodiment of the present invention when connected to a fibre pigtail having four fibre gratings of widely differing distinct pitches.

A multi-wavelength laser can be achieved according to an embodiment of the present invention simply by utilising a fibre pigtail 10 having a plurality of fibre gratings 11. Such a pigtail 10 has been constructed having four gratings 11 of different pitch Λ, chosen so as to give simultaneous lasing at four wavelengths across a broad wavelength range. This pigtail 10 was connected to the semiconductor package of FIG. 1, and the output spectrum of the resulting multi-wavelength laser is shown in FIG. 13. FIG. 13 shows simultaneous lasing at four distinct laser wavelengths. The shortest and longest wavelengths are separated by more than 70 nm.

Figure 14:
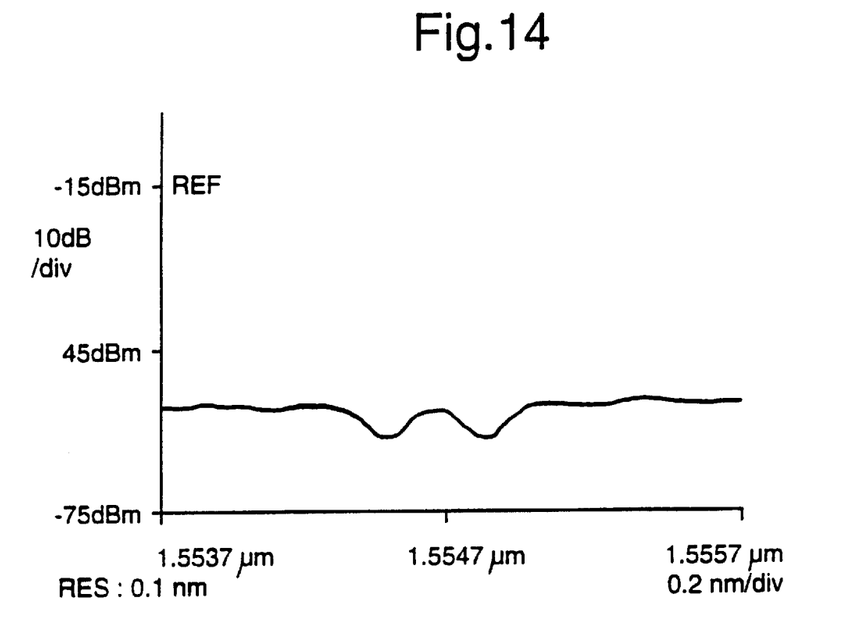
FIG. 14 shows the transmission spectrum of a fibre pigtail having two fibre gratings of slightly differing pitch.
Figure 15:
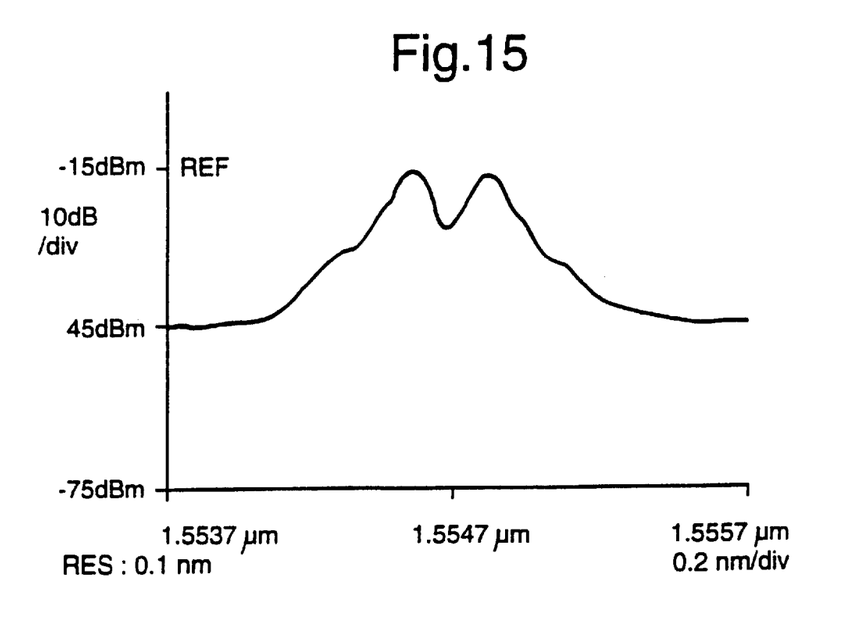
FIG. 15 shows the output spectrum of a semiconductor laser according to the first embodiment of the present invention when connected and the fibre pigtail of FIG. 14.

A further fibre pigtail 10 was constructed having two fibre gratings 11 of slightly differing pitch Λ, chosen so as to give simultaneous lasing at two closely spaced wavelengths. FIG. 14 shows the output spectrum of a laser comprising the semiconductor package of FIG. 1 and the pigtail having two gratings, when the laser is running below its threshold, and is thus indicative of the transmission spectrum of the fibre pigtail. From FIG. 14 it can be seen that the stop bands of the two fibre gratings overlap somewhat, so that there is always some radiation fed back to the laser cavity at all wavelengths between the two centre wavelengths of the fibre gratings. It is for this reason that the output spectrum shown in FIG. 15 has some overlap between the two lasing modes. FIG. 15 shows the output spectrum of this laser when above threshold, and demonstrates simultaneous lasing at two wavelengths less than 0.3 nm apart.

For all of the embodiments of the present invention it is desirable that the fibre pigtail be terminated with different connector types at each end, that is either a male connector at one end and a female connector at the other, and/or different configuration and/or size at each end.

Figure 16:
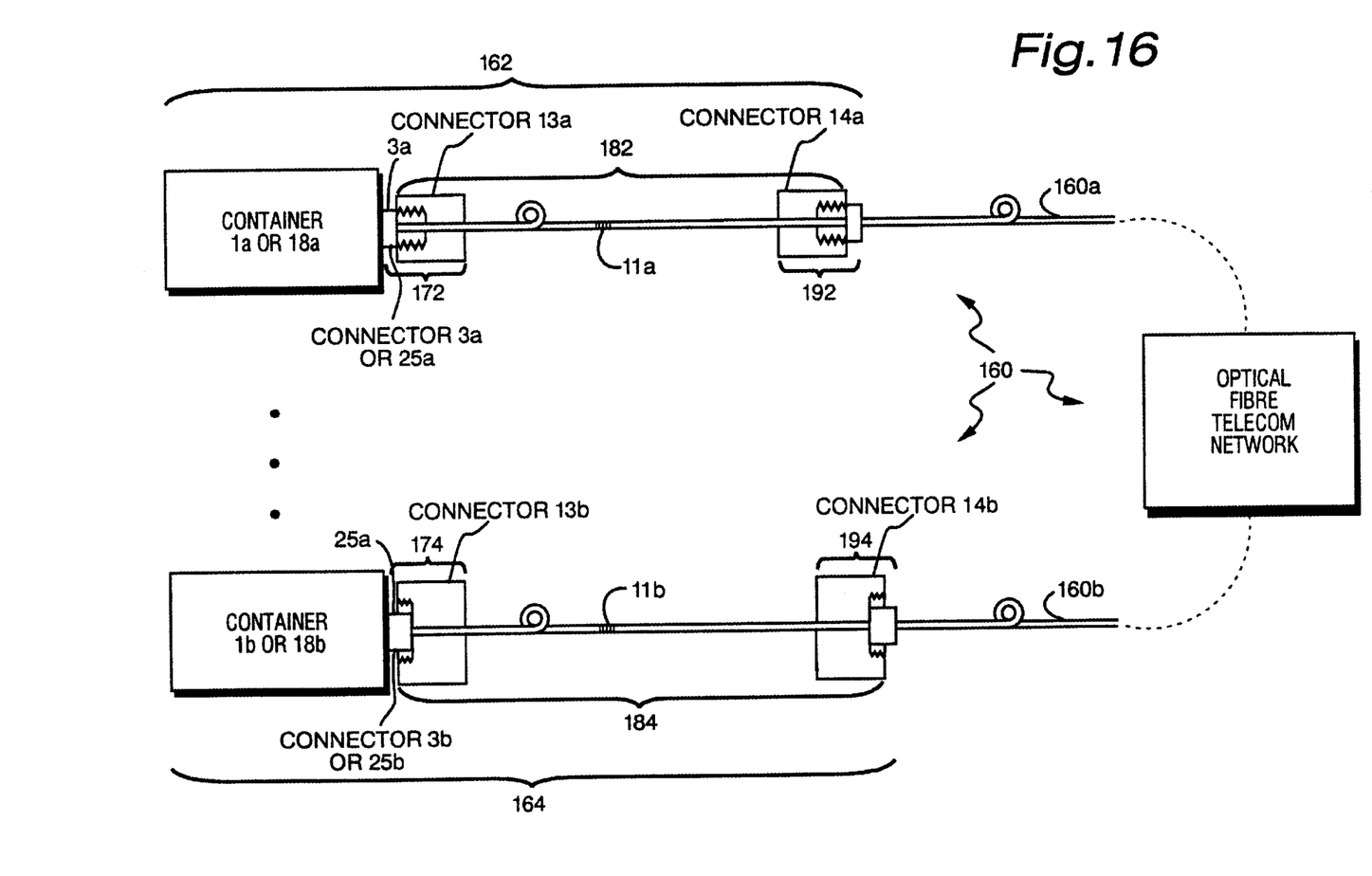
FIG. 16 schematically depicts a telecommunications network employing a plurality of laser structures in accordance with this invention.

The telecommunications network 160 in FIG. 16 includes optical fibre transmission paths (160a, 160b) and a plurality of lasers 162, 164 (e.g., as already described in connection with FIGS. 1, 2 and 8—from which Figures the same reference numerals are used in FIG. 16 together with an added suffix a or b for lasers 162 and 164, respectively) optically coupled to said transmission paths. Each of the plurality of lasers (162, 164) has a laser cavity that includes a demountable optical fibre connector (172, 174) for connecting an external feedback element (182, 184) into the cavity. Each of the plurality of lasers in network 160 may include, besides the first demountable optical connectors (172, 174), a second demountable connector (192, 194) as well where the first optical connector (172, 174) is located between the laser gain medium and the second feedback element (182, 184) and the second optical connector (192, 194) is located between the second feedback element and a transmission fibre (160a, 160b) which provides one of the optical fibre transmission paths of the network 160.

Although embodiments of the present invention have been described in particular for use in optical telecommunications systems, the skilled person will realise that the present invention also has particular application to optical testing equipment, or any other optical equipment, in which there is a requirement to select, cheaply and simply, a wavelength of operation within the gain bandwidth of a gain medium.

It will further be appreciated that other optical components may be incorporated into the fibre pigtail, for example optical isolators.

I claim:

1. A laser comprising first and second feedback elements defining a laser cavity, a gain medium within the laser cavity, a demountable optical connector and an optical waveguide, wherein the second feedback element is wavelength selective, the demountable optical connector is located between the gain medium and the second feedback element, and the optical waveguide is located to direct optical radiation between the demountable optical connector and the second feedback element.

2. A laser as claimed in claim 1, wherein the wavelength selective feedback element comprises a fibre grating.

3. A laser as claimed in claim 1, wherein the optical waveguide comprises an optical fibre.

4. A laser as claimed in claim 1, wherein the first and second feedback elements are both wavelength selective.

5. A laser as claimed in claim 4, wherein the first and second feed back elements are substantially transparent at all optical wavelengths other than the wavelengths at which they feed back optical radiation.

6. A laser as claimed in claim 1, wherein the second feedback element feeds back optical radiation at a plurality of distinct wavelengths into the laser cavity, so that the laser, in use, lases at said plurality of distinct wavelengths.

7. A laser as claimed in claim 1, wherein the gain medium comprises a semiconductor laser diode.

8. A laser as claimed in claim 7, wherein the first feedback element is provided by a first facet of the semiconductor laser diode, and a second facet of the semiconductor laser diode is anti-reflection coated.

9. A laser as claimed in claims 1, wherein the gain medium comprises a fibre doped with a rare earth element.

10. A laser as claimed in claim 9, wherein a first end of the doped fibre is provided with a broadband reflector comprising the first feed back element and a second end of the doped fibre has low reflectivity and is connectorised.

11. A telecommunications network having optical fibre transmission paths and a plurality of lasers optically coupled to said transmission paths, characterised in that each of said plurality of lasers comprises a laser according to claim 1.

12. A telecommunications network as claimed in claim 11 wherein each of said plurality of lasers comprises first and second demountable optical connector means, the first optical connector means being located between the gain medium and the second feedback element, and the second optical connector means being located between the second feedback element and a transmission fibre which provides one of the optical fibre transmission paths of said network.

13. A laser comprising:
first and second feedback elements defining a laser cavity,
a gain medium within the laser cavity,
a demountable optical connector and an optical waveguide,
wherein the second feedback element is wavelength selective, the demountable optical connector is located between the gain medium and the second feedback element, and the optical waveguide is located to direct optical radiation between the demountable optical connector and the second feedback element; and
wherein the second feedback element comprises a plurality of fibre gratings.

14. A package comprising a container,
a semiconductor laser diode mounted in the container,
demountable optical connector means, and a length of optical waveguide, wherein a first end of the optical waveguide is held by the demountable connector means, and a second end of the optical waveguide is aligned to receive, in use, optical radiation from the semi-conductor laser diode and the facet of the semi-conductor laser diode optically closest to the waveguide is adapted to have low reflection.

15. A package as claimed in claim 14, wherein the optical waveguide is of sufficient length and flexibility that mechanical perturbation of the first end of the optical waveguide is substantially not transmitted to the second end of the optical waveguide.

16. A package as claimed in claim 14, wherein the demountable optical connector is mounted to the container.

17. A kit of parts comprising a package as claimed in claim 14 and at least one fibre pigtail for use with a laser comprising a length of buffered optical fibre connectorised at at least one end with a component of a demountable optical connector, the fibre comprising a fibre grating.

18. A fibre pigtail for use with a laser comprising a length of buffered optical fibre connectorised at at least one end with a component of a demountable optical connector, the fibre comprising a fibre grating,
wherein the fibre comprises a plurality of fibre gratings, each fibre grating having a different pitch.

19. An output wavelength adjustable laser comprising:
a gain medium disposed in a laser cavity between first and second reflective elements, at least one of said reflective elements being wavelength-selective in its reflective properties;
said laser cavity including a first optical fibre having a first optical fibre connector disposed on at least one end thereof;
said at least one wavelength-selective reflective element including a wavelength-selective grating formed in a second optical fibre having a second optical fibre connector disposed on at least one end thereof and removably connectable with said first optical fibre connector.

20. An output wavelength adjustable laser as in claim 19 further comprising:
a plurality of said second optical fibres, each having different wavelength-selective reflective properties and each being selectively connectable with said first connector so as to thereby adjust its output wavelength.

21. An output wavelength adjustable laser as in claim 19 wherein said laser cavity includes a semiconductor diode having optical gain.

22. An output wavelength adjustable laser as in claim 19 wherein said laser cavity includes an optical fiber having optical gain.

23. An output wavelength adjustable laser as in claim 19 wherein both said first and second reflective elements comprise wavelength-selective gratings in removably connected optical fibre.

24. An output wavelength adjustable laser as in claim 19 wherein said laser cavity includes a space between a laser diode and a lens structure at one end of said first optical fibre.

* * * * *